United States Patent [19]
Matsuzaki

[11] Patent Number: 5,519,582
[45] Date of Patent: May 21, 1996

[54] MAGNETIC INDUCTION COIL FOR SEMICONDUCTOR DEVICES

[75] Inventor: Kazuo Matsuzaki, Kanagawa, Japan

[73] Assignee: Fuji Electric Co., Ltd., Kanagawa, Japan

[21] Appl. No.: 512,260

[22] Filed: Aug. 7, 1995

Related U.S. Application Data

[63] Continuation of Ser. No. 131,422, Oct. 4, 1993, abandoned.

[30] Foreign Application Priority Data

Oct. 5, 1992 [JP] Japan ................. 4-265221

[51] Int. Cl.[6] .............. H05K 7/02; H01F 27/06; H01F 27/30
[52] U.S. Cl. .............. 361/783; 336/65; 336/208; 361/760
[58] Field of Search .................. 361/760–761, 361/764–765, 783, 807–812, 821; 336/65, 96, 105, 107, 200, 205, 208; 333/119, 177, 181

[56] References Cited

U.S. PATENT DOCUMENTS

| | | | |
|---|---|---|---|
| 3,290,758 | 12/1966 | Moyer | 336/200 |
| 3,305,814 | 2/1967 | Moyer | 336/200 |
| 5,111,169 | 5/1992 | Ikeda | 333/181 |

OTHER PUBLICATIONS

"High–Frequency Operation of a Planar–Type Microtransformer and Its Application to Multilayered Switching Regulators", Yamasawa et al., IEEE Transactions on Magnetics 26(3):1204–1209 May 1990.

"A New Planar Microtransformer For Use In Micro–Switching–Converters", T. Yachi, et al, IEEE 1991 pp. 20–26, 1991.

Primary Examiner—Bot L. Ledynh
Attorney, Agent, or Firm—Finnegan, Henderson, Farabow, Garrett & Dunner

[57] ABSTRACT

A magnetic induction coil is mounted directly on and integrated with a semiconductor wafer containing integrated circuitry for a stable power source. Grooves are etched in the reverse face of the wafer substrate, an insulating film is applied, and conducting material fills the grooves, forming the coil. The coil conductors are connected with wiring conductors from the opposite side through protruding electrodes.

8 Claims, 2 Drawing Sheets

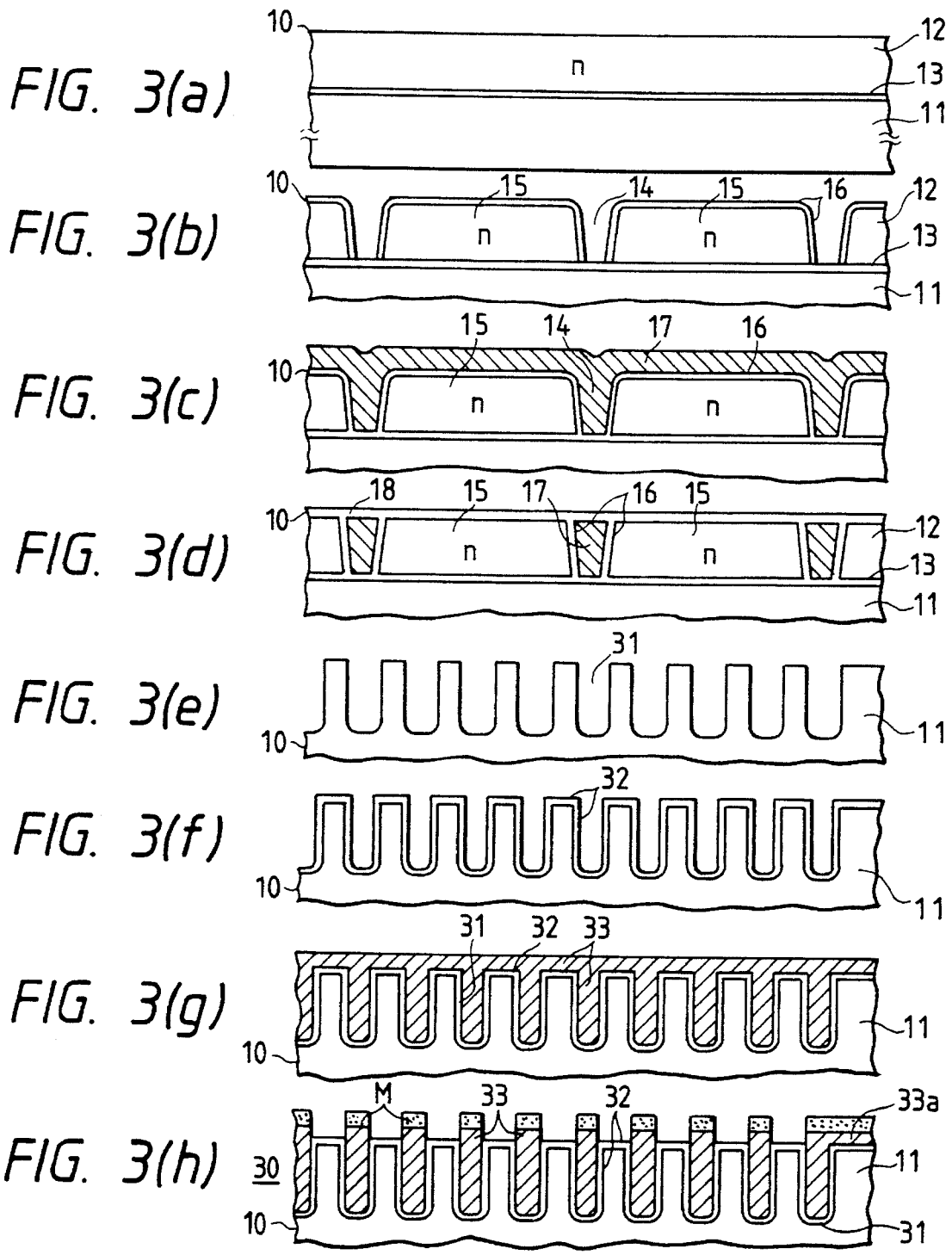

MAGNETIC INDUCTION COIL FOR SEMICONDUCTOR DEVICES

This application is a continuation of application Ser. No. 08/131,422, filed Oct. 4, 1993, now abandoned.

BACKGROUND OF THE INVENTION

1. Field Of The Invention

This invention relates to a magnetic induction coil for use as a transformer or a small inductor in a stable power supply. In particular, the invention relates to a magnetic induction coil integrated into the substrate of a semiconductor device.

2. Discussion Of The Related Art

In the conventional stable power supply, e.g., a switching power source or a chopper control device, the usual method of construction involved fixing independent parts, such as a capacitor or the magnetic inductor of a transformer, on a printed substrate along with an independent semiconductor chip for switching or rectifying. Recently, however, the desire to reduce the size and increase application of these circuits has led to a new architecture known as a Hybrid IC. In such devices, semiconductor elements are fixed on a ceramic substrate as an ordinary chip, and, except for heavy power supplies, it is now possible to integrate all independent elements on the same chip with a control circuit.

In contrast with the rapid integration of the semiconductor elements, it has been difficult to reduce the size of the independent parts, particularly a magnetic induction element. This difficulty retards the downsizing of the entire device.

A conventional magnetic induction element may be reduced in size by raising the operating frequency of the device. Such an increase in operating frequency permits a decrease in the size of the induction element while affording the same reactance. However, at higher frequencies, e.g., above 1 MHz, operating frequency increases tend to have a deleterious effect on and unduly reduce the efficiency of these devices.

Utilizing semiconductor process technology, this problem is solved using a multilayer construction of thin film conductor and a magnetic thin film in a fine structural pattern so as to minimize, simultaneously, an IC circuit and the magnetic induction elements in one chip. Known constructions of thin film multilayer magnetic induction elements include a thin film conductor of spiral-type or zigzag-type coil interposed between a pair of magnetic thin films, and where lines of thin film conductor and magnetic thin film are braided as a fabric. In either construction, since the magnetic induction elements are formed in a small and flat shape under 10 mm in size and only several tens of micrometers thick, the elements can be integrated into one chip of the semiconductor device.

To realize further downsizing, the magnetic induction elements of the above-described thin film multilayer construction are formed in a fine structural pattern of a thin film conductor by use of semiconductor technology, and the construction also has the advantage of raising the frequency characteristics of the inductor so that the operating frequency is over 1 MHz. Because the coil is formed by a thin film conductor, however, the width of the conductor may be limited in order to form the fine structure for the pattern. Accordingly, the current capacity of the magnetic induction elements is also limited, thus limiting the current density in the coil.

In order to solve the above problem, the thickness of the thin film conductor should be increased. However, it is difficult during an etching treatment to form the height of a coil conductor larger than the relative width between lines of the thin film conductor. Moreover, when etched, it is difficult to laminate a thin film on the etched coil conductor due to the larger height, and radiation from the coil is increased.

SUMMARY OF THE INVENTION

The present invention has been made in view of the above circumstances and has as an object to provide a magnetic induction coil with elements formed in a fine structural pattern through use of semiconductor technology so as to realize further downsizing and an increase in current capacity.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purposes of the invention, as embodied and broadly described herein, the magnetic induction coil of this invention comprises grooves formed in a pattern of the coil on the reverse face of a substrate of a semiconductor device, an insulating film formed on the reverse face for covering the substrate including the grooves, and coil conductors filled in the grooves covered by the insulating film, the coil conductors including higher electrically conducting metal, wherein the coil conductors are connected with the wiring conductor on the opposed side of the semiconductor device through protruding electrodes.

BRIEF DESCRIPTION OF THE DRAWINGS

The accompanying drawings, which are incorporated in and constitute a part of this specification illustrate embodiments of the invention and, together with the description, serve to explain the objects, advantages, and principles of the invention.

In the drawings:

FIG. 3(a) is a fragmentary sectional view of chip wafer showing the substrate connecting process to build a coil and semiconductor device in a chip;

FIG. 3 (b) shows the wafer of FIG. 3 (a) after dielectric separating grooves are made and after forming a dielectric film;

FIG. 3 (c) shows the wafer of FIG. 3 (b) after growing a multi-crystal silicon layer;

FIG. 3(d) shows the wafer of FIG. 3(c) after separating the dielectric from the substrate;

FIG. 3(e) shows the wafer of FIG. 3(d) after grooves for the coil are made in the reverse face of the wafer;

FIG. 3(f) shows the wafer of FIG. 3(e) after forming an insulating film covering the coil grooves;

FIG. 3(g) shows the wafer of FIG. 3(f) after filling up the grooves with metal for use as the coil conductor; and FIG. 3(h) shows the completed coil within the chip wafer.

DETAILED DESCRIPTION OF THE PREFERRED EMBODIMENTS

Figure 1A:
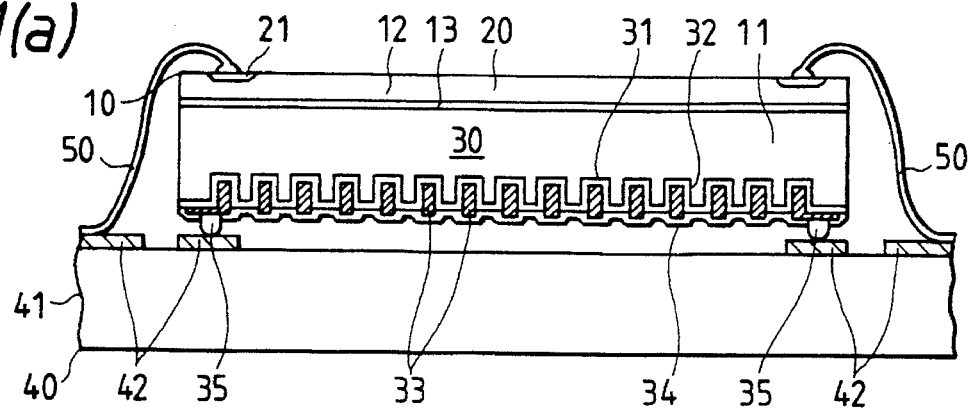
FIG. 1(a) is a sectional view of a chip and an opposed side for mounting thereon the magnetic induction coil elements of an embodiment of the invention.

Reference will now be made in detail to the invention and the present preferred embodiments of the invention, examples of which are illustrated in the accompanying drawings.

The invention provides a magnetic induction coil having deep grooves in a semiconductor substrate on the reverse face of an integrated circuit chip. The grooves form the coil pattern; coil conductors of electrically conducting metal fill the grooves; an insulating film laminated on the reverse face covers the conductor; and protruding electrodes are provided on the ends of the coil conductors for connection with an opposed wiring conductor so as to perform a chip mount with the semiconductor device.

Further, in order to groove the substrate structure with a suitable shape in sufficient depth, plasma etching treatment or reactive ion etching treatment is used. The insulating film is easily made using an oxidized silicon film. The oxidized silicon film is formed by means of steam oxidation of the substrate or the like, but where the semiconductor is already built in the surface of the chip, CVD treatment at lower temperatures is optimum for the formation of the oxidized silicon film. The electric conduction metal for the coil conductor filling the grooves is preferably copper. In order to fill the grooves accurately, it is advantageous to deposit the copper by means of non-electrolysis plating. It is of further advantage to deposit by means of a two-step process of high-speed non-electrolysis and low-speed non-electrolysis plating having a close adhesion to the grooves of the base surface.

When performing the above chip mount, solder bump electrodes are used for the protruding electrodes connecting the coil conductor with the opposed wiring conductor to prevent damage the semiconductor device. In addition, the protruding electrodes may be located on either side of the opposed wiring conductor or the chip. Further, in order to ensure the connection of the coil conductor, connecting portions of the electric conduction metal are located on the reverse face of the substrate of the chip and extend from the coil conductor.

A further advantage of the invention is provided by a second coil element having the same shape as a first coil and integrated into the opposed face of the substrate, the facing coils being separated by a magnetic thin film. In such an arrangement, the substrate of the opposed side makes use of the same semiconductor as the circuit side. Further, the side opposing the magnetic thin film is covered by a covering film so as to hold the magnetic thin film.

The thin film magnetic induction elements are stacked on the face of the semiconductor device. In accordance with the present invention, the sectional area of the coil may be increased by using the vacant area of the reverse side of the semiconductor substrate of a chip. Grooves are made on the reverse side of the substrate by use of an existing pattern for the coil. A coil conductor of electric conduction metal fills the grooves and is covered by an insulating film so that the cross-sectional area of the coil conductor is increased, thereby raising the current capacity. Also, the heat of the coil conductor is radiated to the semiconductor substrate through the insulating film to improve radiation. The coil conductor is connected with a wiring conductor from an opposed side for mounting thereof through protruding electrodes, so that the mount of the chip on the semiconductor device is performed simultaneously at the same time the connection is made.

Figure 1B:
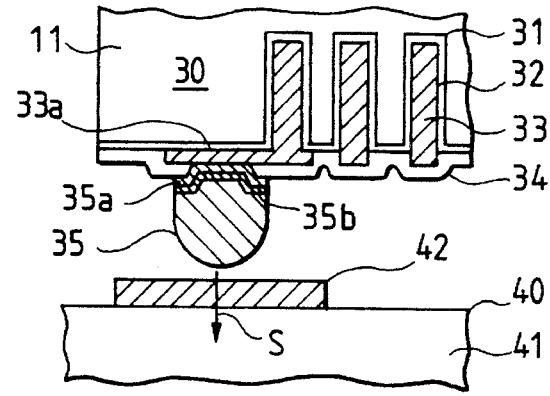
FIG. 1(b) is an enlarged sectional view of a portion of FIG. (a)
Figure 2:
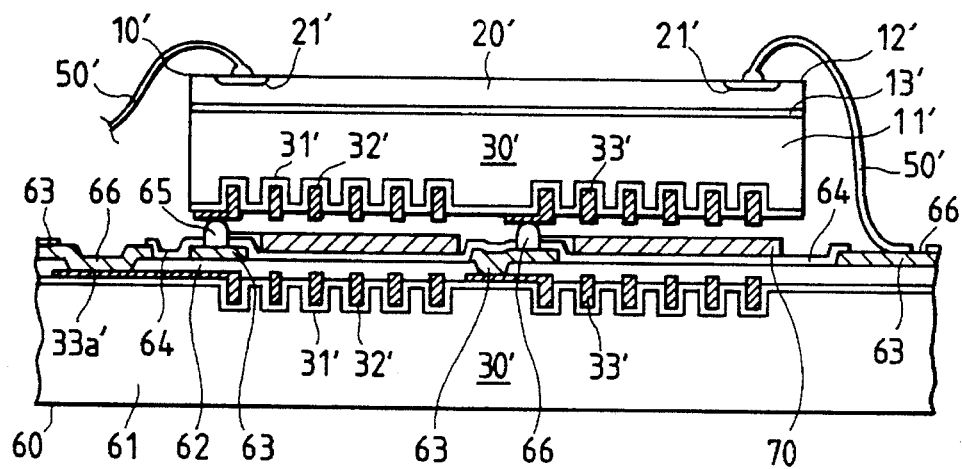
FIG. 2 is a sectional view of a chip and an opposed side for mounting thereon the magnetic induction coil elements of another embodiment of the invention.

FIGS. 1(a) and 1(b) show an exemplary embodiment of the magnetic induction coil of the present invention. FIG. 2, depicting another embodiment of the invention, is a sectional view of a chip and the opposed side for mounting thereon the elements of the magnetic induction coil. FIGS. 3(a) to 3(h) are fragmentary cross-sectional views showing respective steps in a process to build a coil and a semiconductor device in a chip. Additionally, in FIGS. 1(a), 1(b), and 2, a single coil is shown for ease of explanation, but the invention applies to a transformer type having a pattern of two crossing coils.

A chip 10 in FIG. 1(a) is a so-called substrate junction type, formed by lower and upper substrates 11 and 12, respectively, joined by an oxidized film 13. The upper substrate 12 is finished at a thickness of several tens of micrometers, in which is built a semiconductor device 20. This IC circuit includes a control circuit and a switching transistor of a stable power source, rectifier diode, or the like. Connecting pads 21 are shown simply for connecting with outer parts. A coil 30 of the invention is built on the reverse face of the lower substrate 11 which is several hundred micrometers thick, and the coil 30 is connected with wiring conductors 42 on a facing side 40 of ceramic substrate 41, shown as a wiring substrate in FIG. 1(b) by protruding electrodes 35 shown in detail in FIG. 1(b). At the same time as this connection is made, the chip 10 is mounted on the side 40 of the ceramic substrate 41. Further, the semiconductor device 20 in the chip 10 and the connecting pads 21 are connected with the wiring conductors 42 on the facing side 40 of the ceramic substrate by bonding lines 50.

The coil 30 is formed as follows: a plurality of grooves 31 are made on the reverse side of the lower substrate 11 (having a larger thickness) of fine pitch and sufficient depth, e.g., 30 µm; an insulating film 32, e.g., an oxidized silicon layer 1 µm thick, is formed on the reverse side of substrate 11; and electric conducting metal, e.g., copper, fills the grooves 31, becoming coil conductor 33 having a long height shape as shown in FIG. 1(b). The width of the grooves 31 is, for example, 20 µm and the depth is over 30 µm, according to the current capacity to be applied to coil 30. In the example shown in FIGS. 1(a) and 1(b), the coil pattern is a zigzag shape having bent portions at both sides of FIGS. 1(a) and 1(b).

FIG. 1(b) is an enlarged sectional view of a portion of FIG. 1(a). The protruding electrodes 35 are able to be provided on either the coil 30 or the opposed side 40, but the example depicts the protruding electrodes 35 on the former, and makes use of solder bump electrodes. The reverse side of substrate 11 is covered by a covering film 34, e.g., nitriding silicon, together with the coil conductors 33, and the protruding electrodes 35 being provided on the coil 30 through openings of the covering film 34. Since the width of coil conductors 33 is narrow, the copper is extended toward the edge as a connecting portion 33a. Ordinarily, the bumps of the protruding electrodes 35 are formed at the openings where a thin base film 35a, e.g., titan, and a thin base film 35b, e.g., copper, are provided on the connecting portions 33a, the solder growing thereon by electrolysis plating, and the top of the solder being reflowed so as to curve the top.

The chip 10' of another example shown in FIG. 2 has a similar construction, except for the shape of coil 30' on the reverse side forming a spiral. In contrast to FIG. 1, an opposed side 60 of the example is formed with a semiconductor substrate 61 on the mounting portion for chip 10' on the upper face of the substrate 61, coil 30' is formed and connected directly with the coil 30' of the chip 10'. Therefore, coil conductors 33' of the opposed side 60 are covered by an insulating film 62 between layers and wiring conductors 63, e.g., aluminum, are provided, thereon, still further being covered by a covering film 64 having openings for protruding electrodes 65 connecting with the wiring conductors 63, and the covering film 64 being provided with other openings exposing the wiring conductors 63 as connecting pads 66. In the example shown in FIG. 2, a center end of the coil 30' of the opposed side 60 is connected with a center end of the coil 30' of the chip 10' through the wiring conductor 63 and the protruding electrode 65, and another end of the coil 30' of the opposed side 60 is connected with the connecting pad 66 through the connecting portion 33a'.

Further, in the example shown in FIG. 2, a thin magnetic film 70 is provided between the chip 10' and the opposed side 60 so as to arrange a so-called core-type magnetic induction element by both coils 30'. The thin magnetic film 70 may be formed by soft magnetic ferromagnetic metal, ten to several tens of micrometers thick, by means of spatter treatment or the like, and shaped to the desired pattern by means of photo-etching. The film 70 may be applied to either chip 10' or the opposed side 60, but in the example shown in FIG. 2, it is formed on the opposed side 60 to be held upon the covering film 64 covering the surface thereof, since the coil conductors 33' are exposed on the chip 10' side. Explanations of the other portions shown in FIG. 2 having elements similar to the example shown in FIGS. 1(a) and 1(b) are omitted.

In the above examples shown in FIGS. 1(a), 1(b), and 2, since the substrates 11 and 11' are several hundred micrometers thick, even if the pattern of coil 30 and 30' are fine, it may be necessary for grooves 31 and 31' to be further grooved to increase the height of the coil conductors 33 and 33' to raise the current capacity of the coil 30 and 31' to several times that of the conventional coil. Moreover, since the semiconductor devices 20 and 20' of the chips 10 and 10' are comparatively distant from the coil conductors 33 and 33' as shown in FIGS. 1(a), 1(b), and 2, any effect from a magnetic field generated by the current of coil 30 and 30' may be decreased compared to the thin film layer construction.

Next, with reference to FIG. 3, process steps for forming the semiconductor 20 and the coil 30 on the face of chip 10 are explained as follows. FIGS. 3(a) to 3(d) show separation of an area of substrate 12 forming circuit portions and circuit elements of semiconductor device 20. FIGS. 3(e) to 3(h) show processes forming the coil 30 on the reverse face of substrate 11. Since these processes take place on a wafer, chip 10 is called wafer 10 hereinafter. Wafer 10 is a dielectric separation wafer. FIG. 3(a) shows the joined substrates. After mirror finishing to form an oxidized film 13 on one of the surfaces of the substrates 11 and 12, the substrates 11 and 12 are joined as the wafer 10 in an inactive atmosphere at higher temperatures. Substrate 12 is polished to finish to a thickness of several tens of micrometers. The process steps for separating dielectric from the substrate 12 are shown in FIGS. 3(b) to 3(d). First, in FIG. 3(b), the grooves 14 are formed by plasma-etching treatment of substrate 12 from the surface thereof to the oxidized film layer 13, so as to separate a plurality of semiconductor areas 15. The whole surface, including the grooves thus treated, is covered by dielectric film 16, an oxidized film 1 μm thick, by means of steam oxidizing treatment.

FIG. 3(c) shows the process of filling up the grooves with multi-crystal silicon, the grooves 14 being filled by deposited multi-crystal silicon 17 on the whole surface of wafer 10 by means of thermal CVD treatment using silane or a like material. In this example, since the multi-crystal silicon 17 deposits upon the area of the semiconductors 15, a process shown in FIG. 3(d) oxidizes the multi-crystal silicon 17 on wafer 10 to change the multi-crystal silicon 17 to an oxidized film 18, and etches the oxidized film 18 to a predetermined thickness as shown in FIG. 3(d). Because, for example, the n-type substrate 12 is separated dielectrically into a plurality of semiconductor areas 15 insulated from one another by dielectric film 16, the circuit elements and circuit portions of the IC circuit (aforementioned semiconductor 20) are distributed and built in the semiconductor areas 15.

FIGS. 3(e) to 3(h) show the reverse side of substrate 11, previously shown as facing down, facing in the upper direction.

In FIG. 3(e), as a first process building coil 30, the grooves 31 are etched on substrate 11 on the reverse face of wafer 10. Grooves 31 are formed by masking of photo-resist film shaped in a fine pattern for the coil, and in this example, the etching treatment is a plasma-etching treatment in gases such as oxygen and $SF_6$, particularly a reactive-ion etching treatment, so that the deep grooves 31 having a width of 20 μm and a depth over 30 μm may be formed on substrate 11 with the side surface having sufficient shape perpendicular to the surface of substrate 11.

In FIG. 3(f), the surfaces of substrate 11, including grooves 31, are covered by an insulating film 32 of 1 μm thickness. Preferably, insulating film 32 is formed by steam oxidation under 1100° C. before building the semiconductor device 20 in the substrate 12. If performed after formation of semiconductor device 20, it is preferable that insulating film 32 is formed using a plasma CVD treatment under low temperature, e.g., 200° C., using gases such as silane and oxygen.

In FIG. 3(g), grooves 31 are filled by the electric conducting metal for the coil conductor 33. The metal is preferably copper and is preferably grown by means of a two-step non-electrolysis plating treatment. First, low-speed non-electrolysis plating (having better adhesion with a base) is used, and a thin copper film is grown at 20° C. by a plating solution which includes copper sulfate, rochelle salt, formaldehyde, caustic soda, sodium cyanide, etc. Next, using a plating solution including copper sulfate, EDTA 2NA, formaldehyde, caustic soda, and sodium cyanide, high-speed non-electrolysis plating having a figure-up speed more than the low-speed non-electrolysis plating fills copper in grooves 31 at 70° C., covering substrate 11.

In FIG. 3(h), the metal for the coil conductor 33 is etched to form the coil 30. The process forms a predetermined shape for coil 30 by the chemical etching treatment using, for example, hydrochloric acid solution as a mask M of photo-resist film, the connecting portions 33a for the end of the coil 30 being formed on the surface of the substrate 11 to remain as shown in FIG. 3(h). After these process steps, where the protruding electrodes 35 are provided as shown in FIG. 1, the coil conductors 33 are preferably covered by the cover film 34; but the coil conductors may be exposed as shown in FIG. 2.

The present invention may be performed by other arrangements not mentioned in the examples above. The above examples use a dielectric separation construction for the substrate portion of the device, but, for example, the substrate may be made using a joint separation construction.

Further, with respect to filling the grooves with the coil conductor metal, vapor deposition electrolysis plating or the like or a combination thereof may be used. There are degrees of freedom for arranging the magnetic thin film and the coil; a variety of selections regarding the magnetic induction element which is an inductor or a transformer; and the determination of whether or not the magnetic thin film is included in the chip.

As was described above, the magnetic induction coil elements of the invention comprise grooving on the reverse face of a semiconductor which has a semiconductor device or IC circuit on the face thereof, forming an insulating film on the reverse face of the substrate including the grooves, providing coil conductors consisting of electric conducting metal filling the grooves covered by the insulating film, wherein protruding electrodes are provided on ends of the coil conductors for connecting the coil conductors with an opposed wiring conductor so as to perform a chip mount with the semiconductor device. The magnetic induction coil elements have the following effects:

(a) Because the coil is built through the skillful use of the reverse face of the semiconductor, even if the coil pattern is finned for minimization the grooves may be formed at a thickness of several hundred micrometers so as to increase the height of the coil conductor, raising the current capacity of the coil to several times the capacity of the conventional device.

(b) Because the coil conductors are inserted between the grooves like the teeth of a comb, the heat generated from the coil may be radiated to the semiconductor substrate through the thin insulating film, raising the radiation effectiveness compared to the conventional thin film layering construction (piling up the thin film conductor and the magnetic thin film through the insulating film) and further raising the current capacity.

(c) Because the semiconductor device or circuit is mounted on the opposite side at the same time that the coil conductors are connected with the wiring conductor of the opposite side through the protruding electrodes, construction time is reduced.

(d) Because the semiconductor device on the face of the chip is sufficiently distant from the coil conductors, compared to the thin film layers construction, the magnetic field effects generated by the coil current on the semiconductor are reduced.

Furthermore, because the coil of the invention is mounted as a chip on the opposite side of the semiconductor device, the stabilizing power source is not integrated completely in one chip, but the opposite side is reduced to a similar size.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A magnetic induction device, the elements of which are coupled to a semiconductor device, comprising:

a two-faced substrate containing a semiconductor device on one face;

grooves formed in a pattern of a coil on a reverse face of the substrate;

an insulating film formed on said reverse face for covering said substrate and lining said grooves; and coil conductors disposed in said grooves over said insulating film lining thereby forming said coil, said coil conductors including higher electrically conductive metal.

2. A magnetic induction device according to claim 1, further comprising protruding electrodes at ends of said coil conductors to connect with wiring conductors of an opposed side substrate and to mount said substrate on said opposed side together with said semiconductor device.

3. A magnetic induction device according to claim 1, wherein said coil conductors include copper treated by non-electrolysis plating.

4. A magnetic induction device, the elements of which are coupled to a semiconductor device, comprising:

a two-faced substrate containing a semiconductor device on one fact;

grooves formed in a pattern of a coil on a reverse face of the substrate;

an insulating film formed on said reverse face for covering said substrate and lining said grooves;

coil conductors disposed in said grooves over said insulating film lining thereby forming said coil, said coil conductors including higher electrically conductive metal;

protruding electrodes disposed at ends of said coil conductors for connecting with wiring conductors of an opposed side substrate and to mount said substrate on said opposed side with said semiconductor device; and another coil provided on a surface of said opposed side, and where a magnetic thin film is formed thereon, so that a magnetic inducting element consists of said coil on said substrate having said semiconductor device, said another coil of said opposed side and said magnetic thin film.

5. A magnetic induction device, comprising:

a two-faced substrate having one face and a reverse face;

a semiconductor device disposed on said one face;

the reverse face of the substrate having a pattern of grooves corresponding to an induction coil;

electric conduction metal filling said grooves; and an insulating film covering the reverse face of said substrate including the electrically conductive metal-filled grooves.

6. A device according to claim 5, wherein the substrate is a first substrate and the electrically conductive metal-filled grooves have electrodes at opposite ends of the grooves protruding from the insulating film, said device further comprising a two-faced second substrate having one face opposing the reverse face of the first substrate, said one opposing face of the second substrate having conductors disposed thereon connected to the protruding electrodes of the reverse face of the first substrate.

7. A device according to claim 5, wherein said electrically conductive metal includes copper treated by non-electrolysis plating.

8. A device according to claim 6, wherein said one opposing face of the second substrate has a pattern of grooves corresponding to an induction coil which are filled with electrically conductive metal, and a magnetic thin film is formed thereon, said electrically conductive metal-filled grooves on said reverse face of the first substrate, said electrically conductive metal-filled grooves of the one opposing face of the second substrate, and said magnetic thin film forming a magnetic induction element.

* * * * *